Feb. 11, 1969 D. CHAUVY ET AL 3,427,479

SILICON PLANAR TRANSISTOR

Filed Jan. 19, 1966

Daniel Chauvy,
Raymond Guye and
Kurt Hubner, Inventors

By Wenderoth, Lind and Ponack
Attorneys

United States Patent Office 3,427,479

Patented Feb. 11, 1969

3,427,479
SILICON PLANAR TRANSISTOR

Daniel Chauvy, Corcelles, and Raymond Guye and Kurt Hübner, Neuchatel, Switzerland, assignors to Centre Electronique Horloger, Neuchatel, Switzerland, a corporation of Switzerland Filed Jan. 19, 1966, Ser. No. 521,706
Claims priority, application Switzerland, Jan. 29, 1965, 1,288/65
U.S. Cl. 307—299 6 Claims
Int. Cl. H01l 3/12, 19/00

ABSTRACT OF THE DISCLOSURE

A silicon planar transistor having a silicon body with a base region, a collector region and an emitter region. These three regions are monolithic integrated regions in the silicon body with a collector-base junction and a base-emitter junction. The base region extends over a substantial part of the collector region in the silicon body and ends in two metallic contacts, one of which is situated near the emitter region and constitutes the standard basis contact, and the other metallic contact is situated adjacent a part of the collector region and touching the latter. The base region is partly covered on the silicon body by a layer forming a part of the collector region.

The present invention has for object a silicon planar transistor.

The aim of the invention is the production of a transistor having a large capacity between the collector and the base, of which the apparent collector-base current $I_{CBO}$ is controlled and is made proportional to the voltage applied between these two electrodes, of which the ordinary leakage current of the collector-base junction is negligible relative to the controlled current and finally of which the gain in current is high at low levels.

The transistor according to the invention is characterised in that the base has an extension the end of which is short-circuited to the collector and in that it has an area of the same type of conduction as the emitter and covering the greater part of the base.

This transistor permits securing a simple pilot circuit for a mechanical resonator, said circuit being of reduced dimensions and of low consumption which may be employed as a portable timing apparatus.

The invention also has for object a use of the transistor in a pilot circuit of a mechanical resonator, which is characterised in that the circuit includes, besides the transistor, a winding, a source of current and a capacity.

The drawing shows, by way of example, one embodiment of the transistor, and one embodiment of the use.

Figure 1:
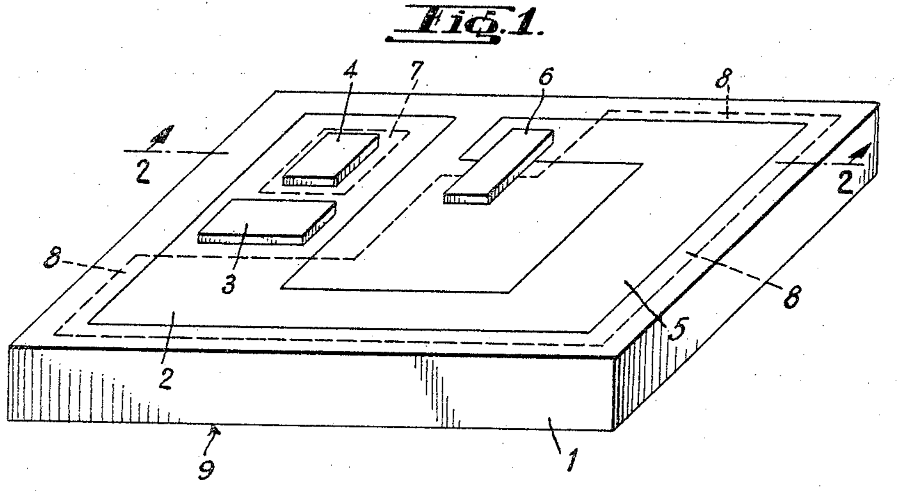
FIG. 1 is a view in perspective and on a very large scale of this embodiment.
Figure 2:
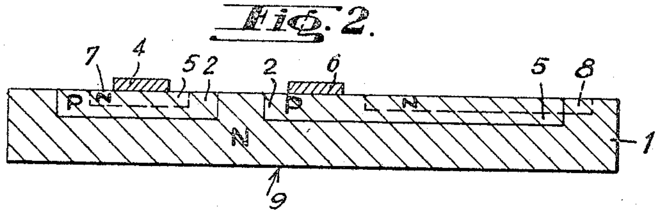
FIG. 2 is a sectional view along line 2—2 of FIG. 1.

The transistor shown in FIGS. 1 and 2 includes a silicon block 1 of the N type. A junction PN, base-collector is formed by doping the area 2, for example with boron. This doping may be effected by diffusion, the control of the geometry being carried out according to the well known technique utilising photoresisting lacquers. The shape of this junction differs from that of ordinary transistors in that on the one hand it is much larger than that necessary for the contact 3 of the base and for the contact 4 of the emitter and in that on the other hand it has an arm 5 terminating in a metallised area 6. In this example, this arm 5 consists of three rectilinear segments at right angles. In other cases, it could have a serpentine shape.

The emitter-base junction PN, the shape of which has been shown in dash lines in FIG. 1, may be obtained by doping the area 7, for example with phosphorus, according to the same technique as for the formation of the junction 2.

The transistor includes an unusual junction which has been obtained by doping the area 8 at the same time and in the same manner as the emitter area 7. In FIG. 1, the shape of this area 8 has been shown in dash lines.

The lower face 9 of the block 1 constitutes the contact of the collector.

In this example, one has not described the disposition of the oxide layers because it is well known in the manufacture of transistors according to planar technique.

The operation of the transistor is the following:

The greater capacity between the collector and the base results firstly from the greater surface of the area 2 and secondly of the area 8 which covers the greater part of the area 2 and increases the surface of the base-collector junction. The area 8 is particularly important to this end because the concentration of the impurities at the junction formed between the areas 2 and 8 is considerably higher than that at the junction formed between the areas 1 and 2, which greatly increases the capacity per unit of surface. By way of example, the total capacity between the base and the collector is between 50 and 600 picofarads at zero voltage. In normal transistors adapted to operate as average and high frequency amplifiers, the base-collector capacity is obviously harmful and it is avoided by reducing to a maximum the surface of the base-collector junction, only permitting the necessary surface for the emitter 7 and the base contact 3.

The relation between the surface of the collector-base junction and the surface of the base-emitter junction is provided above 10, preferably included between 100 and 10,000.

The controlled collector-base current is obtained by the extension 5 of the base 2 and the contact 6 between the base and the collector. The high values, included between 0.1 and 5M ohms, between the base and the collector are obtained firstly by the extension 5 of the base 2 and secondly by reducing the section of the extension 5 of the base by the diffused area 8 as shown in FIG. 2. By the provision of 8, the active part of the extension 5 is in diffused structures, limited to a high resistivity area.

The ordinary leakage currents through the base-collector junction are maintained low due to the presence of the area 8. It is well known in the trade that diffusions which are carried out with a source of liquid glass at the surface containing boron or phosphorus further act as a getter and eliminate excessive leakage currents. When 8 is formed by such a diffusion process, the additional surface of the base-collector junction only slightly increases the normal leakage current through the junction.

Further, since the area 8 covers the greater part of the base 2 and that it penetrates into the silicon, it follows that the base-collector junction does not reach the surface. This eliminates the surface leakage currents which are often much greater than those of volume.

The apparent $I_{CBO}$ current between the base and the collector is for this reason given by the resistance of the extension 5 of the base 2 and the voltage between the collector and the base.

The high gain at very low power level is ensured by choosing the dimension of the emitter as low as permitted by present technique, that is to say of a diameter of 4 to 50 microns.

The particular characteristics of this transistor do not require any additional manufacture operation. For this reason, manufacture costs are comparable to those of an ordinary planar transistor.

In spite of the modifications of the geometry, as compared with a normal transistor, the high gain at low power levels is maintained. The total volume is but slightly larger than that of a normal transistor.

Figure 3:
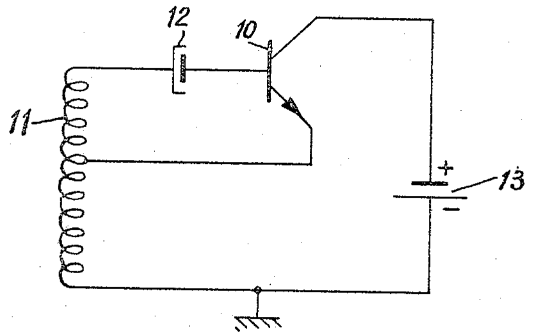
FIG. 3 is a diagrammatic view of the pilot circuit of a mechanical resonator using the transistor.

FIG. 3 shows a circuit for maintaining in oscillation an oscillator piloted by a mechanical resonator not shown, and utilising the transistor according to the invention.

This diagram, which looks like that of an LC oscillator, actually cannot oscillate on its relatively high frequency given by the inductance L and its own capacity, due to the high capacity of the collector of the special transistor, which short-circuits the collector at this frequency. This circuit serves on the contrary to maintain in oscillation a mechanical resonator of low frequency coupled to the winding by magnets fixed on said resonator. Said oscillating magnets produce by induction an alternative tension on the winding so that the special transistor is activated as a switch at said low frequency, supplying energy for maintaining in oscillation the oscillation of the mechanical resonator. The capacity of the collector does not oppose the good functioning at said low frequency. The current flowing through the arm of the elongated base to the collector serves mainly for the start.

In addition to the transistor 10, the circuit only includes an inductance 11 having a central connection connected to the emitter of the transistor, the two end terminals being connected the one to the base by a condenser 12 and the other to the negative pole of a cell 13 the positive pole of which is connected to the collector of the transistor. An ordinary transistor would not operate in such a simple circuit.

What we claim is:

1. A silicon planar comprising a silicon body with a base region, a collector region and an emitter region, these three regions being monolithic integrated regions in said silicon body, a collector-base junction and a base-emitter junction, said base region extending over a substantial part of said collector region in said silicon body and ending in two metallic contacts, one of which is situated near said emitter region and constitutes the standard basis contact, and the other metallic contact is situated adjacent a part of said collector region and touching the latter, and said base region being partly covered on said silicon body by a layer forming a part of the collector region.

2. Transistor according to claim 1, wherein the relation between the surface of the collector-base junction and the surface of the base-emitter junction exceeds 10.

3. Transistor according to claim 2 wherein said relation is between 100 and 10,000.

4. Transistor according to claim 1, wherein said layer is bent-shaped with respect to the surface of the silicon body.

5. Transistor according to claim 1, wherein said layer is serpentine-shaped with respect to the surface of the silicon body.

6. A circuit for maintaining in oscillation a mechanical resonator, said circuit comprising in series a source of current, a winding, a capacitor and a silicon planar transistor comprising a silicon body with a base region, a collector region and an emitter region, these three regions being monolithic integrated regions in said silicon body, there being provided a collector-base junction and a base-emitter junction, the base region extending over a substantial part of the collector region in the silicon body and ending in two metallic contacts, one of which is situated near the emitter region and constitutes the standard basis contact, and the other metallic contact is situated adjacent a part of the collector region and touching the latter, and said base region being partly covered on said silicon body by a layer forming a part of the collector region, the base of said transistor being connected to said capacitor, the collector of said transistor being connected to one terminal of said current source, and the emitter of said transistor being connected to an intermediate terminal of said winding.

References Cited

UNITED STATES PATENTS 3,277,394 10/1966 Holt et al.

JOHN W. HUCKERT, *Primary Examiner.*

J. R. SHEWMAKER, *Assistant Examiner.*

U.S. Cl. X.R.

317—235; 331—116